United States Patent [19]
Denlinger

[11] 4,021,839
[45] May 3, 1977

[54] DIODE PACKAGE

[75] Inventor: Edgar Jacob Denlinger, East Windsor, N.J.

[73] Assignee: RCA Corporation, New York, N.Y.

[22] Filed: Oct. 16, 1975

[21] Appl. No.: 622,866

[52] U.S. Cl. ................................. 357/74; 357/79; 357/72; 357/81; 357/73

[51] Int. Cl.² ................. H01L 23/02; H01L 23/12; H01L 23/28; H01L 23/42

[58] Field of Search ................. 357/74, 79, 81, 72, 357/73

[56] References Cited
UNITED STATES PATENTS

| | | | |
|---|---|---|---|
| 2,864,980 | 12/1958 | Mueller et al. | 357/79 |
| 2,897,419 | 7/1959 | Howland et al. | 357/79 |
| 3,234,437 | 2/1966 | Dumas | 357/79 |
| 3,476,986 | 11/1969 | Tsuji | 357/79 |
| 3,921,192 | 11/1975 | Goronkin et al. | 357/13 |

Primary Examiner—Andrew J. James
Attorney, Agent, or Firm—Robert M. Rodrick; Joseph D. Lazar; Edward J. Norton

[57] ABSTRACT

A diode package comprising a compressible dielectric member having an aperture extending through its two major opposite surfaces. An electrically conductive lid is attached on one of the major surfaces of the dielectric member and an electrically conductive base is attached on the other surface. A semiconductor diode having two terminals oppositely situated is soldered with one diode terminal to the base within the aperture of the dielectric member. The lid is further soldered to the other diode terminal subsequent to the compressible dielectric member being compressed an amount sufficient for the lid to make an electrical connection to the other diode terminal.

7 Claims, 4 Drawing Figures

DIODE PACKAGE

BACKGROUND OF THE INVENTION

1. Field of the Invention

This invention relates to a diode package and more particularly to a diode package having a compressible dielectric member.

2. Description of the Prior Art

It is often desirable to construct a diode package which has low values of capacitance, inductance and resistance in order to meet particular electrical requirements. One such application utilizes a PIN diode that switches inductors in and out of a varactor-tunable resonator filter used in TV tuners. Diode packages having the above-mentioned electrical properties are highly desirable in such TV tuners, especially at UHF frequencies (470–890 MHz) wherein such frequencies excessive package parasitics limit the available tuning bandwidth of a varactor and high package resistance deteriorates the loss of the preselector and postselector filters of the tuner. Another such application of a diode package having such characteristics is in microwave circuits using high power TRAPATT diodes wherein effective heat dissipation is necessary for desired performance.

Many of the prior art diode packages are formed of a hollow cylindrical spacer member of dielectric material with electrically conductive contact members covering the end faces of the spacer member. A diode enclosed within such a spacer member is mounted generally with one diode terminal attached directly to one conductive contact member and with the other diode terminal connected to the other contact member by thin bonding wires or ribbon. Typical examples of this structure are shown in U.S. Pat. No. 3,787,782 entitled "Microwave Device," issued on Jan. 22, 1974, and U.S. Pat. No. 3,320,497 entitled "Variable Capacitance Diode Packages," issued on May 16, 1967. One problem with such a package structure is the high inductance and resistance resulting from the thin bonding wires or ribbon which are connected to the diode. The wire or ribbon in these packages is typically very thin to assure a good bond to the diode, the bond usually formed by spot welding or thermo-compression bonding. Some prior art structures utilize a plurality of bonding wires to reduce the high resistance which results from the thin wire but undesirable parasitic effects due to high inductances are still present. Also, the use of thin wire or ribbon to connect the diode does not contribute effectively to the dissipation of heat and allows heat transfer only through the diode terminal attached directly to the conductive contact member.

Other prior art packages are fabricated without bonding wires and utilize contact pressure to make an electrical connection between an electrically conductive contact member and the diode. One problem with this type package is that external pressure means are generally required to maintain the electrical contact. These pressure means contribute to the complexity of the package and hence its cost. However, and of more significance, pressure contacts are not reliable in assuring a good electrical connection. Air gaps and voids which may be caused by nonuniform distribution of pressure or uneven material finishes at the interfacing surfaces create undesirable parasitic effects which degrade performance of the device. Severe variations in temperature may tend to reduce the contact pressure which may also result in reduced contact area, or, possibly, in an open circuit.

Another desirable quality of such diode packages in addition to the electrical properties is the cost of fabrication. Simplicity of construction is one important factor for low cost fabrication. The bonding of wires or ribbons to diodes in the prior art arrangements is generally a time-consuming operation and often very difficult requiring highly skilled operators or costly equipment or both. In addition to the desirable simplicity of structure, another cost factor is the capability of making diode packages in quantity. Many of the prior art packages utilize ceramic beryllia (BeO) or alumina ($Al_2O_3$) as the dielectric material for the insulating spacer member. These ceramics have excellent electrical insulating characteristics and fairly low dielectric constants ($\epsilon_r \approx 10$) for minimizing the package capacitance and have good heat conducting properties, especially beryllia. However, these ceramics are not desirable for cutting or slicing operations useful in producing diode packages in quantity. The cutting or slicing of beryllia requires special tools and equipment since the dust which may be produced is toxic. Both alumina and beryllia are very brittle and cutting or slicing operations would tend to result in a high breakage rate making these materials undesirable for such cutting or slicing processes.

SUMMARY OF THE INVENTION

According to the present invention, a diode package includes a compressible dielectric member having two major substantially parallel opposite surfaces having an aperture extending perpendicularly through the two major surfaces. An electrically conductive base covers and is soldered to one of the major surfaces of the dielectric member. A semiconductor diode having two terminals oppositely situated is within the aperture, one of the terminals being soldered to the base. An electrically conductive lid covers and is soldered to the other major surface of the dielectric member and is further soldered to the other terminal of the diode subsequent to the compressible dielectric member being compressed an amount sufficient for the lid to make an electrical connection to the other diode terminal.

DETAILED DESCRIPTION OF THE PREFERRED EMBODIMENT

Figure 1:
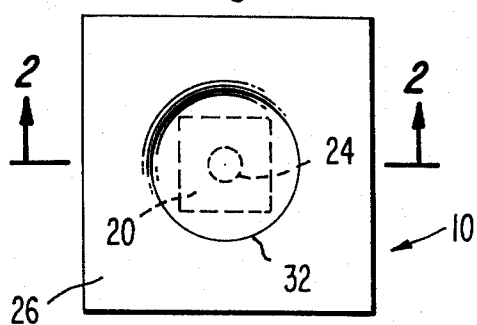
FIG. 1 is a plan view of a preferred embodiment of the diode package according to the invention.
Figure 2:
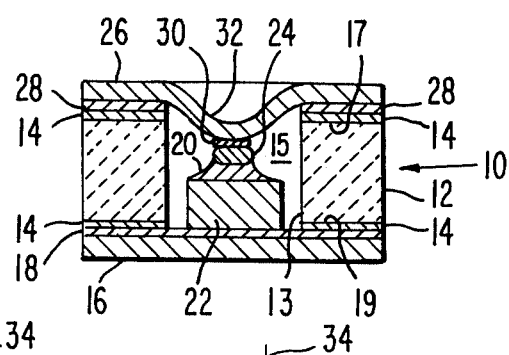
FIG. 2 is a sectional side elevation view of the diode package as seen along viewing line 2—2 of FIG. 1.

Referring to FIGS. 1 and 2, there is shown a diode package 10 constructed in accordance with the present invention. Although it is preferable for diode package 10 to be in the general form of a rectangular parallelepiped, it may also be cylindrical, cubic, or in any other geometric form as desired.

Package 10 comprises a hollow spacer member 12 of dielectric material having two parallel major surfaces 17 and 19 and a hole 15 defined by an inner wall 13. To maintain a low package capacitance at UHF frequencies or at microwave frequencies, spacer member 12 is preferably formed of material having a relatively low dielectric constant ($\epsilon_r \approx 2.3$). Preferably for construction purposes to be detailed subsequently, spacer member 12 is made of proprietary materials marketed under the tradenames of "Duroid" or "Fluoroglass." Duroid is available from Rogers Corporation, Rogers, Conn. and "Fluoroglass" from Atlantic Laminates, Franklin, N.H. Both materials consists of Teflon-fiberglass i.e., polytetrafluoroethylene reinforced with fiberglass and can be obtained with metallization. These materials have a dielectric constant of about 2.35 and are not brittle as a ceramic but are more pliable. Other insulating materials having a larger dielectric constant (approx. 10) such as beryllia (BeO) or alumina ($Al_2O_3$) may, however, also be used.

The two parallel major surfaces 17, 19, of spacer member 12 are clad or metallized with a layer of copper 14 to provide metallic surfaces upon which to bond electrically conductive contact members. Base 16, formed of electrically conductive material, preferably gold-plated copper, is made to conform to the periphery of spacer member 12. Base 16 is connected to the metallized surface 19 of spacer member 12 by solder 18, which may be a solder pre-form of tin-silver (melting temperature of 221° C) formed to about the same size as base 16 and approximately 0.0005 inch thick.

A semiconductor diode 20 having two terminals 22 and 24 is mounted within hole 15 of spacer member 12, terminal 22 being connected to base 16, preferably by solder 18 although additional solder may be used, as for example, by an additional solder pre-form.

An electrically conductive lid 26 is attached to the other metallized surface 17 of spacer member 12 by solder 28. Solder 28 is suitably made of tin-silver solder similar to solder 18. Lid 26 is preferably gold-plated copper and suitably shaped to effect a direct connection between the inner surface of lid 26 and terminal 24 of diode 20 by solder 30. Solder 30 is also suitably formed of a tin-silver solder.

In the embodiment illustrated, the height of diode 20 and its terminals 22 and 24 is less than the height of spacer member 12. Accordingly, to provide a direct connection to the lid 26, an indentation 32 is formed. Design choices may require that lid 26 be formed with a protrusion to accommodate a diode of larger dimensions than the spacer member 12. It will be appreciated that in practice, the dimensions of the spacer member 12 and the shape of lid 26 will be determined by the package capacitance desired and the dielectric properties of the material used.

The indentation 32 in lid 26 eliminates the need for one or more bonding wires heretofore used in many prior art packages to provide an electrical connection between the diode and the lid. Furthermore, by soldering lid 26 to diode terminal 24, a direct connection is made assuring a good electrical contact without external contact pressure utilized in other prior art packages. Lid 26 is made of a relatively thick plate which not only minimizes the package inductance and resistance due to relatively wide conducting paths from diode 20, but also improves heat dissipation from diode 20. Prior art use of bonding wires or ribbon, usually quite thin, cannot transfer the heat effectively. Thus, double heat sinking capability is effected and low junction temperatures with high power devices such as TRAPATT diodes are achieved with a package constructed in accordance with this invention.

Diode packages having low values of capacitance, inductance and resistance as described herein can be used with PIN diodes in varactor-tunable resonator filters in TV tuners. As an example, such a diode package may be made in the form of a rectangular parallelepiped having plan view square sides of 0.046 inch. Spacer member 12 made of the preferred dielectric material is 0.010 inch in height with a hole 15 of 0.025 inch inner diameter and base 16 and lid 26 are both made of copper 0.005 inch thick. The height of spacer member 12 is made small and with the relatively low dielectric constant of such material, the capacitance of such a package is made quite low, i.e., about 0.09 picofarads (pf). The relatively thick lid 26 in comparison to spacer member 12 results in a package inductance of only 0.03 nanohenries (nh) and a resistance of about 0.01 ohms.

Figure 3:
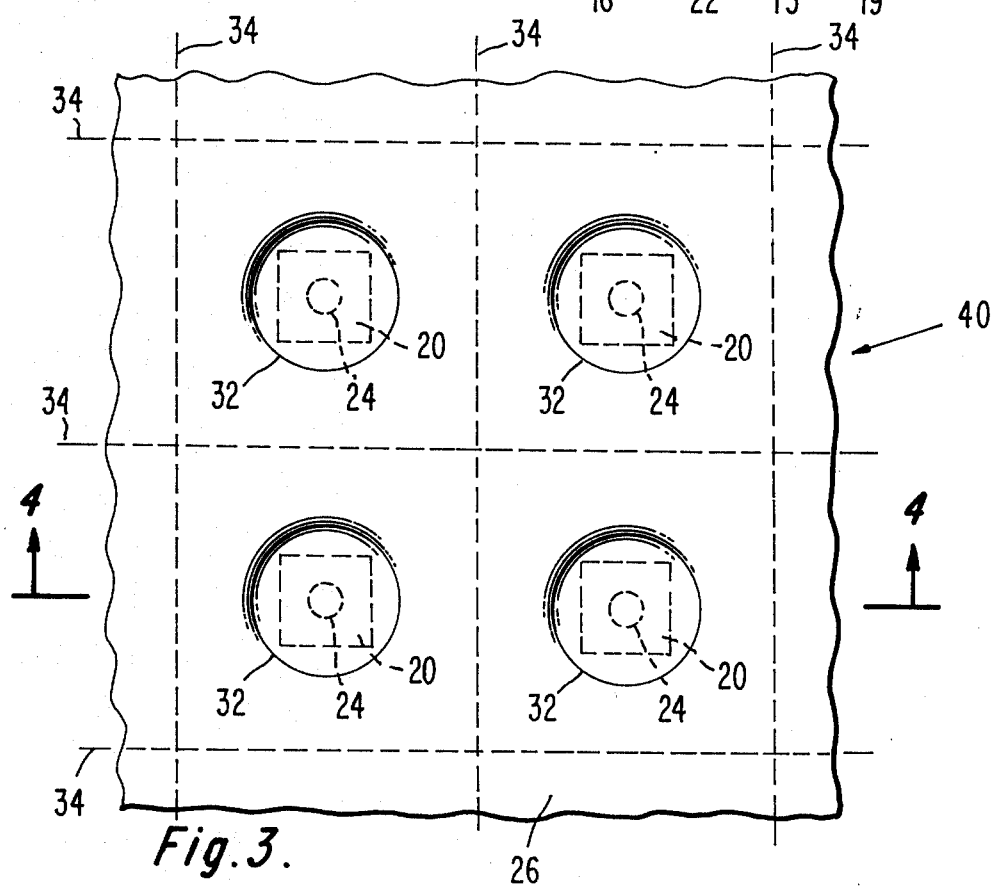
FIG. 3 is a plan view of a portion of a solder-bonded composite sheet of diode packages shown prior to being cut into a plurality of individual diode packages.
Figure 4:
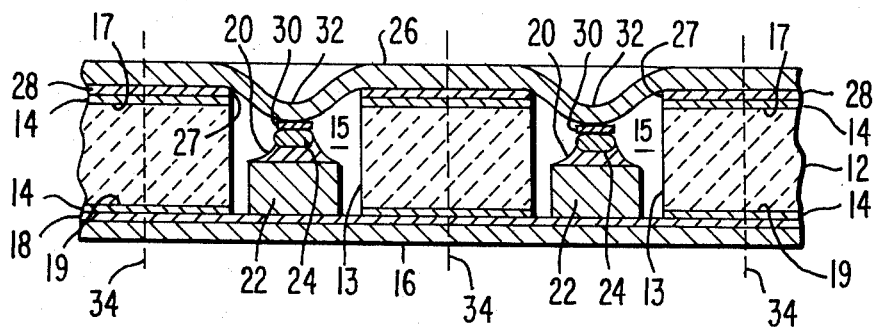
FIG. 4 is a sectional side elevation view of the composite sheet structure as seen along viewing line 4—4 of FIG. 3.

A plurality of diode packages as described above can be made in accordance with a method of the present invention to provide for cost-reduced package fabrication. As seen in FIGS. 3 and 4 a composite sheet or assemblage 40 of diode packages is formed. The materials used to form assemblage 40 are the same as the materials used for the individual diode package 10, described previously, the reference numerals of FIGS. 1 and 2 being used to indicate the corresponding elements.

Dielectric spacer member 12 is formed to a shape of a plane or sheet having two major substantially parallel surfaces 17 and 19 respectively. Surfaces 17 and 19 are metallized or clad with a layer of copper 14 to provide metallic surfaces upon which to connect electrically conductive contact members. A plurality of holes 15 defined by inner walls 13 are formed perpendicularly through surfaces 17 and 19, holes 15 being substantially parallel to each other and periodically spaced at intervals selected to provide for desired individual package dimensions. Although it is preferable that planar spacer member 12 be metallized prior to forming holes 15, it will be appreciated that holes 15 may be formed prior to metallizing where the metallizing procedure includes suitable masking techniques.

To facilitate the forming of holes 15, it is preferable that planar spacer member 12 be made of Duroid for its pliable properties as described previously. Since Duroid is more resilient than a ceramic dielectric material, holes can be punched or stamped in spacer member 12 without cracking or breaking the material. Thus, a plurality of holes 15 may be formed cheaply and quickly by utilizing an automatic punching machine programmed to provide for desired hole diameters and spacing.

An electrically conductive base 16 is formed to the same periphery as the periphery of planar spacer member 12. First solder material 18, formed to cover substantially the surface of base 16, is placed on base 16 and metallized surface 19 of spacer member 12 is positioned on first solder material 18. A semiconductor doide 20 having terminals 22 and 24 is inserted into each of holes 15, terminal 22 of each diode being placed onto first solder material 18. Second solder material 28 formed with a plurality of holes 27 is positioned on the metallized surface 17 of spacer member 12. Holes 27 are approximately the same diameter and are in substantial registration with holes 15 of spacer member 12. An electrically conductive lid 26 is placed on second solder material 28 covering the other end of holes 15 remote from the end covered by base 16. Lid 26 is formed with a plurality of indentations 32, the indentations 32 being substantially coincident with holes 15. The depth of each of indentations 32 is sufficient to make a direct connection to the other terminal 24 of each diode 20 by third solder material 30, which is inserted between lid 26 and diode terminal 24.

By compressing the assemblage just described, the component parts are held together for heating to form the solder-bonded composite sheet 40. By utilizing the preferred Duroid as the spacer member material, one problem of assembling the composite sheet 40 is minimized. Since the indented portion of lid 26 is to contact diode terminal 24, as by solder material 30, the depth of indentations 32 and the height of diodes 20 are generally quite critical in making the required contact and the variations in tolerances are significant. However, because the preferred Duroid is more compressible than a ceramic, the tolerance deviation problem is alleviated by the capability of Duroid to compress sufficiently to assure the required contact between lid 26 and diode terminal 24. The desired contacts can be obtained without using this more compressible material, but closer tolerances and more quality control is required, increasing thereby the cost of production.

Preferably, the heating of the compressed assemblage is performed in an oven, although heat may be applied through other well-known heat transfer media such as temperature-controlled hot plates. In production facilities, such heating and subsequent requisite cooling of the soldered joints may be accomplished on a conveyer system.

The composite sheet or assemblage 40 upon cooling of the solder after heating is cut into individual diode packages as by along the dotted lines 34 preferably by an automatic machine cutter or saw. The use of Duroid further facilitates the cutting operation since the material is pliable and permits a package with a relatively thin spacer member. Also, by cutting the diode packages into the more preferrable form of a rectangular parallelepiped, the separating process is more simple and thus, less costly.

What is claimed is:

1. A diode package comprising a compressible dielectric member having two major substantially parallel opposite surfaces and having an aperture extending perpendicularly through said major opposite surfaces, an electrically conductive base covering and soldered to one of said major surfaces of said dielectric member, a semiconductor diode within said aperture, said diode having two terminals oppositely situated, one of said terminals of said diode being soldered to said base, an electrically conductive lid covering and soldered to said other major surface of said dielectric member, said lid being further soldered to the other of said terminals of said doide subsequent to said compressible dielectric member being compressed an amount sufficient for said lid to make an electrical connection with said other terminal of said diode.

2. A diode package according to claim 1, wherein the material of said compressible dielectric member is polytetrafluoroethylene reinforced with fiberglass.

3. A diode package according to claim 1, wherein said semiconductor diode is a PIN diode.

4. A diode package according to claim 1, wherein said semiconductor diode is a TRAPATT diode.

5. An assemblage of diode packages comprising:
 a planar compressible dielectric member having a plurality of apertures extending perpendicularly through its major opposite surfaces;
 an electrically conductive planar base covering and soldered to one of said major surfaces of said dielectric member;
 one diode positioned within each of said apertures, each diode having two terminals oppositely situated, one terminal of each said doide being soldered to said base;
 an electrically conductive planar lid covering and soldered to the other major surface of said dielectric member;
 said lid being further soldered to the other terminal of each of said diodes subsequent to said compressible dielectric member being compressed an amount sufficient for said lid to make electrical connection with said other terminal of each said diode whereby each diode can be selected from a plurality of diodes having a relatively wide range of tolerances in height.

6. An assemblage according to claim 5, wherein the material of said compressible dielectric member is polytetrafluoroethylene reinforced with fiberglass.

7. An assemblage according to claim 5, wherein said planar lid is formed with a plurality of indentations substantially coincident with said apertures in said dielectric member, each of said lid indentations being soldered to a diode terminal subsequent to compressing said assemblage.

* * * * *